(12) United States Patent
Yan et al.

(10) Patent No.: US 11,017,997 B2
(45) Date of Patent: May 25, 2021

(54) METHODS AND APPARATUS FOR LOW TEMPERATURE SILICON NITRIDE FILMS

(71) Applicant: Applied Materials, Inc., Santa Clara, CA (US)

(72) Inventors: Wenbo Yan, Sunnyvale, CA (US); Cong Trinh, Santa Clara, CA (US); Ning Li, San Jose, CA (US); Mihaela Balseanu, Sunnyvale, CA (US); Li-Qun Xia, Cupertino, CA (US); Maribel Maldonado-Garcia, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/477,671

(22) PCT Filed: Jan. 11, 2018

(86) PCT No.: PCT/US2018/013320
§ 371 (c)(1),
(2) Date: Jul. 12, 2019

(87) PCT Pub. No.: WO2018/132568
PCT Pub. Date: Jul. 19, 2018

(65) Prior Publication Data
US 2019/0348271 A1 Nov. 14, 2019

Related U.S. Application Data

(60) Provisional application No. 62/446,276, filed on Jan. 13, 2017.

(51) Int. Cl.
*H01L 21/02* (2006.01)
*C23C 16/34* (2006.01)
(Continued)

(52) U.S. Cl.
CPC ........ *H01L 21/0217* (2013.01); *C23C 16/345* (2013.01); *C23C 16/45542* (2013.01);
(Continued)

(58) Field of Classification Search
CPC ........... H01L 21/0217; H01L 21/02211; H01L 21/02274; H01L 21/0228; C23C 16/345; C23C 16/45542
See application file for complete search history.

(56) References Cited

U.S. PATENT DOCUMENTS 7,172,792 B2   2/2007  Wang et al.
9,685,406 B1 * 6/2017  Briggs .................. H01L 23/528
(Continued)

FOREIGN PATENT DOCUMENTS

JP   2010532717 A   10/2010
JP   2015119045 A    6/2015
(Continued)

OTHER PUBLICATIONS

Andringa et al. Low-Temperature Plasma-Assisted Atomic Layer deposition of Silicon Nitride Moisture Permeation Barrier Layers, Applied materials & interfaces 2015, 7, 22525 (Year: 2015).*
(Continued)

*Primary Examiner* — Matthew L Reames
(74) *Attorney, Agent, or Firm* — Servilla Whitney LLC

(57) ABSTRACT

Processing methods for forming a silicon nitride film comprising exposing a metal surface to a silicon precursor, a nitrogen-containing reactant and a hydrogen-containing plasma at a temperature less than or equal to about 250° C. to form a silicon nitride film with a low etch rate without damaging the metal surface.

4 Claims, 10 Drawing Sheets

(51) Int. Cl.
*C23C 16/455* (2006.01)
*H01L 21/687* (2006.01)

(52) U.S. Cl.
CPC .... *H01L 21/0228* (2013.01); *H01L 21/02211* (2013.01); *H01L 21/02274* (2013.01); *H01L 21/68771* (2013.01)

(56) References Cited

U.S. PATENT DOCUMENTS

| | | |
|---|---|---|
| 2006/0084283 A1 | 4/2006 | Paranjpe et al. |
| 2008/0274605 A1 | 11/2008 | Hoshi et al. |
| 2014/0273527 A1 | 9/2014 | Niskanen et al. |
| 2015/0126045 A1 | 5/2015 | Chatterjee et al. |
| 2015/0179519 A1 | 6/2015 | Rho |
| 2016/0148806 A1* | 5/2016 | Henri .............. H01L 21/0217 438/775 |

FOREIGN PATENT DOCUMENTS

| | | |
|---|---|---|
| KR | 20050085779 A | 8/2005 |
| KR | 101461139 B1 | 11/2014 |
| WO | 2004057653 A2 | 7/2004 |

OTHER PUBLICATIONS

Edmonds et al. Low temperature thermal ALN of SiNx interfacial diffusion barrier and interface passivation layer on SixGe1-x(001) and SixG1-x(110), Journal of Chemical Physics 146, 052820 (Year: 2017).*

Alvarez et al "Low Temperature Thermal ALD of Silicon Nitride Utilizing a Novel High Purity Hydrazine Source," IOP Science ECS Abstraces, vol. Ma2018-02,G02Atomic Layer deposition Applications 14, 2018. (Year: 2018).*

PCT International Search Report and Written Opinion in PCT/US2018/013320 dated May 3, 2018, 11 pages.

Goto, Hiroshi , et al., "Atomic layer controlled deposition of silicon nitride with self-limiting mechanism", Appl. Phys. Lett. 68, 3257 (1996); https://doi.org/10.1063/1.116566, Jun. 4, 1998.

Nakajima, Anri , et al., "Low-temperature formation of silicon nitride gate dielectrics by atomic-layer deposition", Appl. Phys. Lett. 79, 665 (2001); https://doi.org/10.1063/1.1388026, Jul. 23, 2001.

* cited by examiner

METHODS AND APPARATUS FOR LOW TEMPERATURE SILICON NITRIDE FILMS

CROSS-REFERENCE TO RELATED APPLICATIONS

This application is the National Stage entry of PCT/US2018/013320, filed on Jan. 11, 2018, which claims priority to U.S. Provisional Application. Ser. No. 62/446,276, filed Jan. 13, 2017, the entire disclosures of which are hereby incorporated herein in their entireties.

TECHNICAL FIELD

Embodiments of the disclosure are directed to methods and apparatus for the deposition of silicon nitride films. In particular, embodiments of the disclosure are directed to methods and apparatus for low temperature deposition of silicon nitride films as a cobalt liner.

BACKGROUND

As semiconductor device sizes continue to shrink below the 10 nm regime, traditional patterning processes using photolithography technology are becoming more challenging. Some of these challenges lead to non-precise patterning and degraded device performance. Additionally, multiple patterning technologies use complicated and costly fabrication processing equipment.

Historically, silicon-based low k films have been deposited by ALD in a furnace chamber. To achieve chosen film properties, the film is often deposited at temperatures greater than 500° C. in the furnace chamber. With the thermal budgets continually decreasing with each chip node, there is a need for methods of depositing low k films at temperatures below 500° C.

There is a need in the art for methods and apparatus to deposit silicon nitride films at low temperatures with low wet etch rates.

SUMMARY

One or more embodiments of the disclosure are directed to methods of forming a silicon nitride film. The methods comprise providing a substrate having a metal layer thereon. The metal surface is exposed to a silicon precursor to form a silicon-containing film on the metal surface. The silicon-containing film is exposed to a nitrogen-containing reactant to form a silicon nitride film on the substrate surface. The silicon nitride film on the substrate surface is exposed to a hydrogen-containing plasma to form a low etch silicon nitride film. The method is performed at a temperature less than or equal to about 250° C.

Additional embodiments of the disclosure are directed to methods of forming a silicon nitride film. The methods comprise providing a substrate having a cobalt layer thereon. The substrate surface is exposed to a silicon precursor to form a silicon-containing film on the cobalt layer. The silicon-containing film is exposed to a nitrogen-containing reactant to form a silicon nitride film on the cobalt layer. The silicon nitride film on the substrate surface is exposed to a high density hydrogen-containing plasma to form a low etch silicon nitride film. The high density hydrogen-containing plasma is generated by a vertical plasma source. The exposure to the silicon precursor, the nitrogen-containing reactant and the hydrogen-containing plasma is repeated to form a low etch silicon nitride film of a predetermined thickness. The method is performed at a temperature less than or equal to about 250° C. After formation of the low etch silicon nitride film, there are no sputtered cobalt spheres diffused into the low etch silicon nitride film.

Further embodiments of the disclosure are directed to methods of depositing a film. The methods comprise providing a substrate with a cobalt layer. The substrate is exposed to a silicon precursor in a first process region of a processing chamber. The substrate is laterally moved through a gas curtain to a second process region of the processing chamber. The substrate is exposed to a nitrogen-containing reactant in the second process region of the processing chamber. The substrate is laterally moved through a gas curtain to a third process region of the processing chamber. The substrate is exposed to a first hydrogen-containing plasma generated by a first power source coupled to a first match circuit. The first power source has a first phase. The substrate is laterally moved through a gas curtain to a fourth process region of the processing chamber. The substrate is exposed to the silicon precursor in the fourth process region. The substrate is laterally moved through a gas curtain to a fifth process region of the processing chamber. The substrate surface is exposed to the nitrogen-containing reactant in the fifth process region of the processing chamber. The substrate is laterally moved through a gas curtain to a sixth process region of the processing chamber. The substrate is exposed to a second hydrogen-containing plasma in the sixth process region of the processing chamber. The second hydrogen-containing plasma is generated by a second power source coupled to a second match circuit. The second power source has a second phase. One or more of the first phase and the second phase is controlled to maintain a phase difference in the range of about 170° to about 190°.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
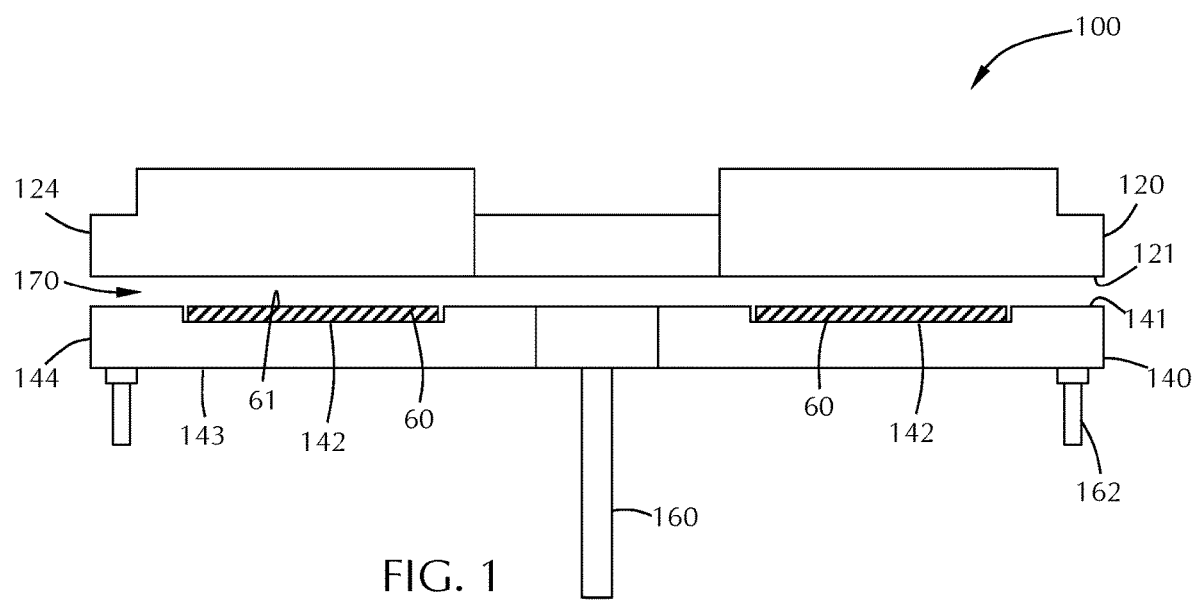
FIG. 1 shows a cross-sectional view of a batch processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap. As used in this specification and the appended claims, the terms "precursor", "reactant", "reactive gas" and the like are used interchangeably to refer to any gaseous species that can react with the substrate surface.

As used in this specification and the appended claims, the terms "precursor", "reactant", "reactive gas" and the like are used interchangeably to refer to any gaseous species that can react with the substrate surface.

One or more embodiments of the disclosure are directed to spatial plasma enhanced atomic layer deposition (PEALD) processes for depositing silicon nitride for cobalt liner at low temperature (<=250° C.). The presence of Cobalt in the device limits the temperature of the silicon nitride process. Some embodiments advantageously provide processes for depositing SiN at 250° C. using a vertical plasma source (VPS) with one or more of $H_2$, $N_2$, and/or Ar gases. The resulting films were observed to have low wet etch rates and good step coverage on device structures. The step coverage after 1 minute of a 1% HF etch was as high as 80%. Some embodiments advantageously provide silicon nitride films in which there is little or no damage on the underneath cobalt liner.

Some embodiments advantageously provide processes using VPS plasma sources with different frequencies allowing for tuning of the ion density and plasma directionality. In some embodiments, two VPS sources were used with different frequency phase angles and showed an improvement in plasma coupling. Some embodiments of the disclosure provide a silicon nitride film as a metal thermal barrier on the susceptor for improving plasma treatment on the device sidewall.

Some embodiments advantageously provide improved device sidewall step coverage after wet etch compared to currently available silicon nitride films and processes.

Embodiments of the disclosure provide apparatus and methods to modulate film properties of plasma-enhanced atomic layer deposited (PEALD) SiN. Batch processing architecture can enable the use of multiple (e.g., 2 or 4) RF generators for PEALD deposition. In some embodiments, the film property modulation can be achieved by tuning the phase difference between the RF generators used for the deposition process. The effect can be achieved by changing the way the RF plasma of different process regions of the processing chamber is coupled into the system.

Some embodiments of the disclosure are directed to processes of depositing a material using a batch processing chamber, also referred to as a spatial processing chamber. FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer peripheral edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 2:
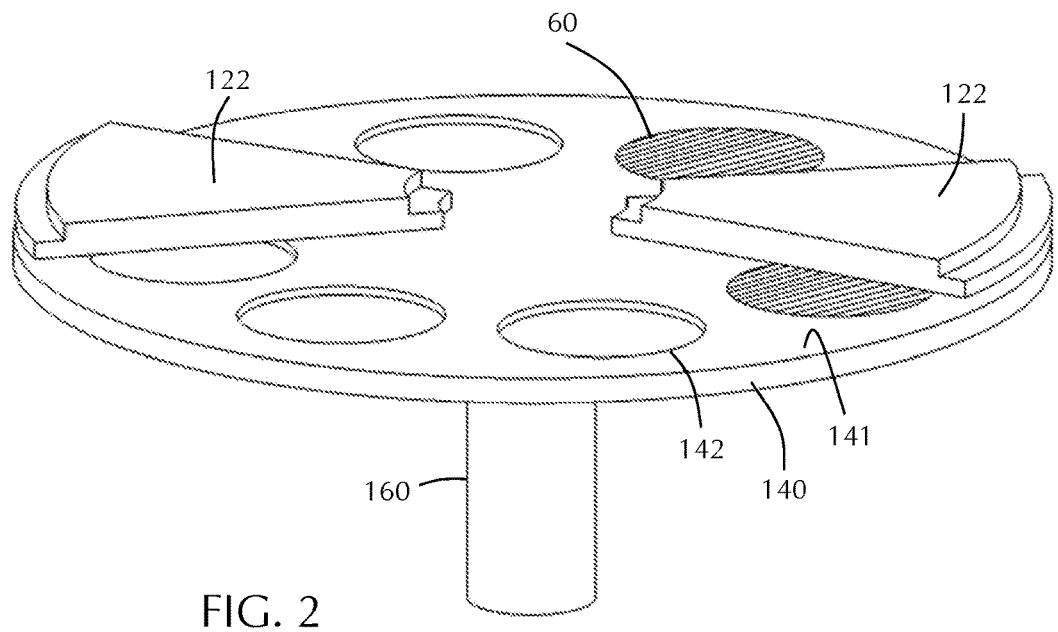
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within 0.5 mm, ±0.4 mm, ±0.35 mm, ±0.30 mm, ±0.25 mm, ±0.20 mm, ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
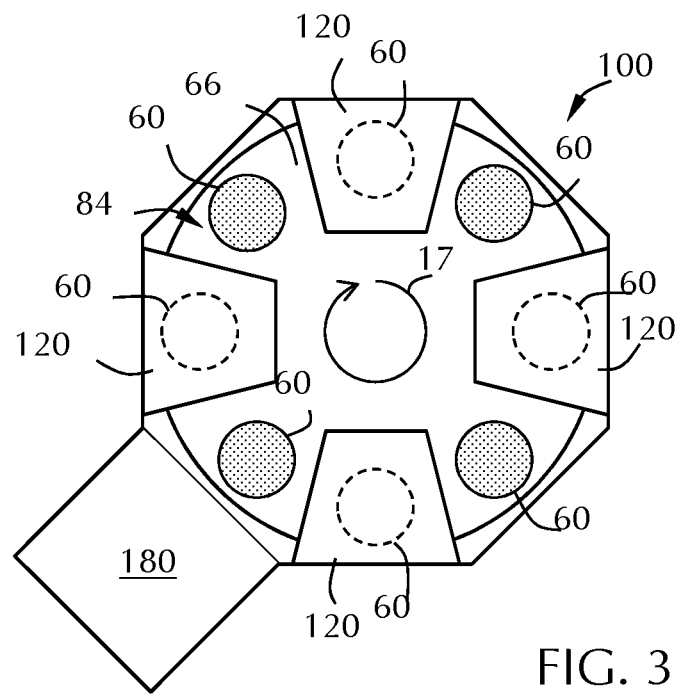
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the gas distribution assemblies 120. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the gas distribution assemblies 120. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one. In an exemplary embodiment, the gas distribution assembly 120 includes eight process regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
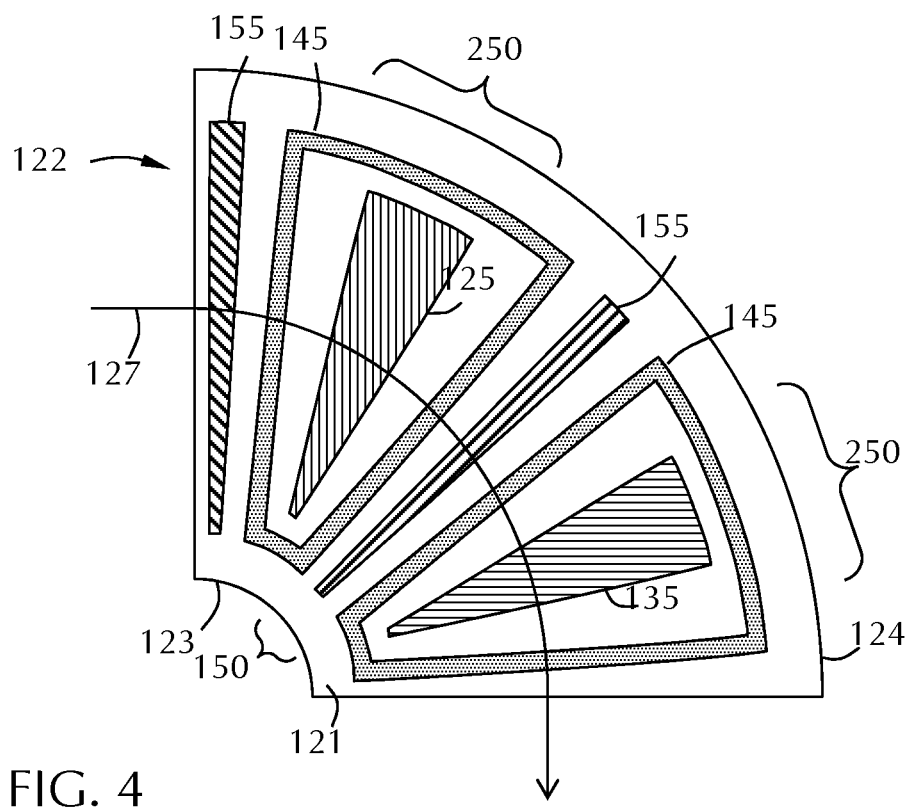
FIG. 4 shows a schematic view of a portion of a wedge shaped gas distribution assembly for use in a batch processing chamber in accordance with one or more embodiment of the disclosure.
Figure 5:
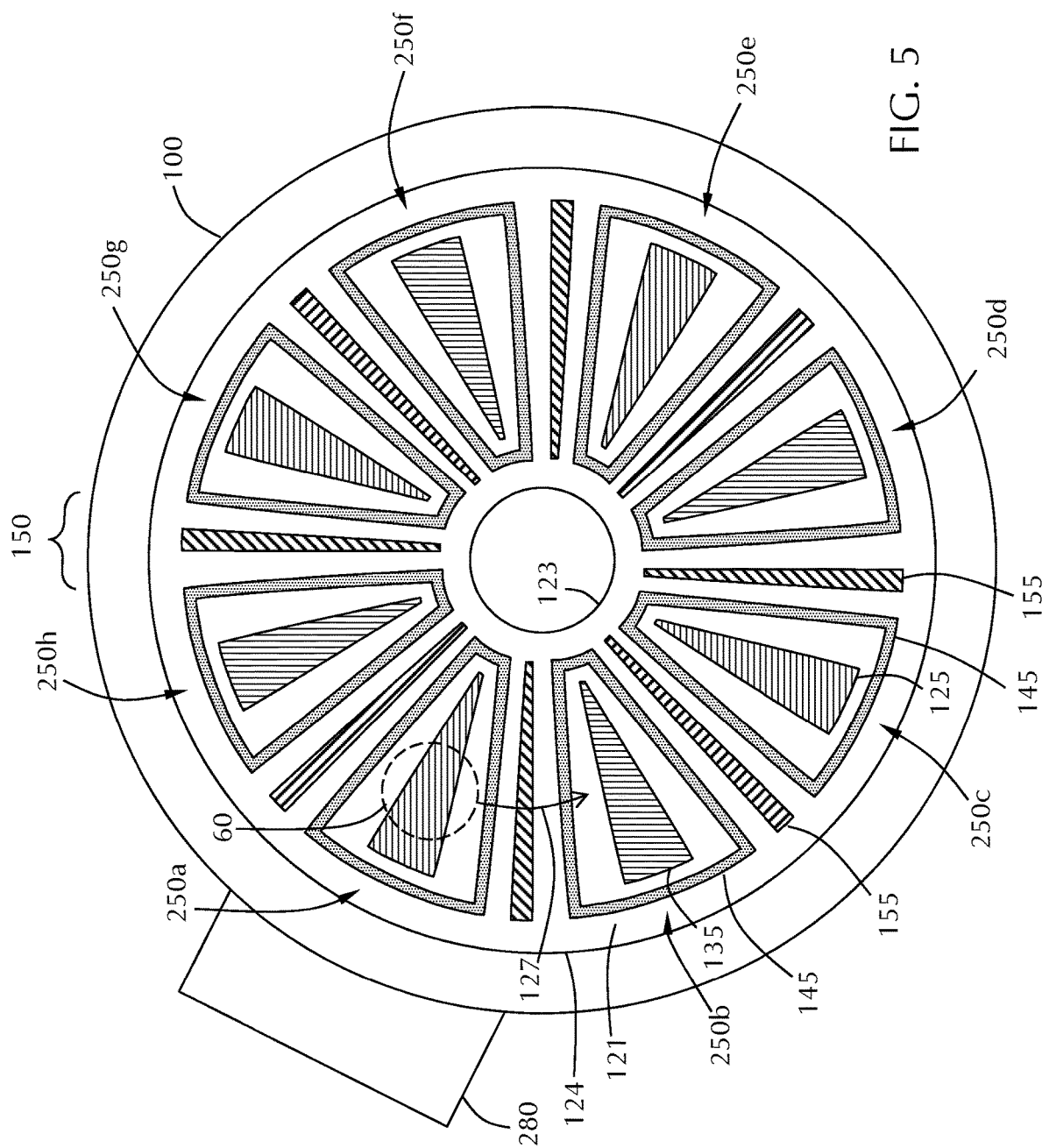
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 155 and vacuum ports 145 in a front surface 121 of the gas distribution assembly 220. The plurality of elongate gas ports 125, 135, 155 and vacuum ports 145 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first reactive gas from the first reactive gas port 125 and the second reactive gas from the second reactive gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of process regions 250. The process regions are roughly defined around the individual gas ports 125, 135 with the gas curtain 150 between 250. The embodiment shown in FIG. 5 makes up eight separate process regions 250 with eight separate gas curtains 150 between. A processing chamber can have at least two process region. In some embodiments, there are at least three, four, five, six, seven, eight, nine, 10, 11 or 12 process regions.

During processing a substrate may be exposed to more than one process region 250 at any given time. However, the portions that are exposed to the different process regions will have a gas curtain separating the two. For example, if the leading edge of a substrate enters a process region including the second gas port 135, a middle portion of the substrate will be under a gas curtain 150 and the trailing edge of the substrate will be in a process region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120. The substrate 60 is loaded via the factory interface 280 into the processing chamber 100 onto a substrate support or susceptor assembly (see FIG. 3). The substrate 60 can be shown positioned within a process region because the substrate is located adjacent the first reactive gas port 125 and between two gas curtains 150*a*, 150*b*. Rotating the substrate 60 along path 127 will move the substrate counter-clockwise around the processing chamber 100. Thus, the substrate 60 will be exposed to the first process region 250*a* through the eighth processing region 250*h*, including all process regions between.

Embodiments of the disclosure are directed to processing methods comprising a processing chamber 100 with a plurality of process regions 250*a*-250*h* with each process region separated from an adjacent region by a gas curtain 150. For example, the processing chamber shown in FIG. 5. The number of gas curtains and process regions within the processing chamber can be any suitable number depending on the arrangement of gas flows. The embodiment shown in FIG. 5 has eight gas curtains 150 and eight process regions 250a-250h.

A plurality of substrates 60 are positioned on a substrate support, for example, the susceptor assembly 140 shown FIGS. 1 and 2. The plurality of substrates 60 are rotated around the process regions for processing. Generally, the gas curtains 150 are engaged (gas flowing and vacuum on) throughout processing including periods when no reactive gas is flowing into the chamber.

Accordingly, one or more embodiments of the disclosure are directed to processing methods utilizing a batch processing chamber like that shown in FIG. 5. A substrate 60 is placed into the processing chamber which has a plurality of processing regions 250, each process region separated from adjacent process regions by gas curtains 150.

Figure 6:
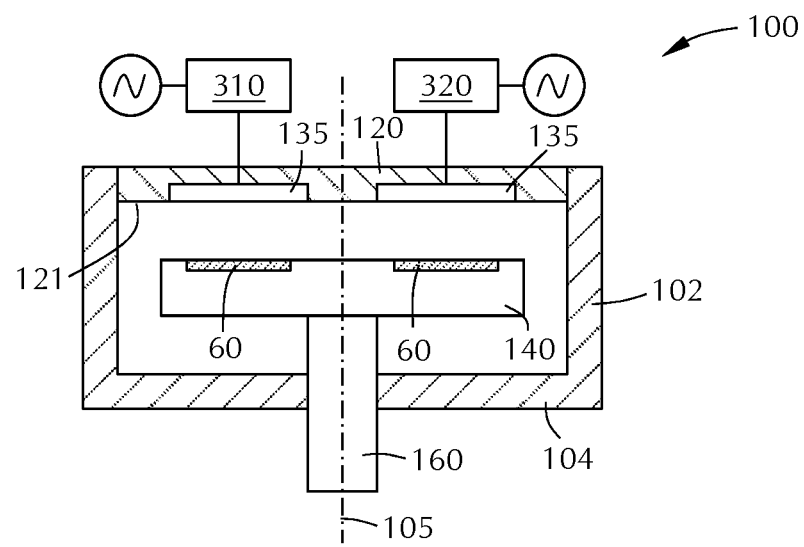
FIG. 6 shows a cross-sectional view of a batch processing chamber in accordance with one or more embodiment of the disclosure.

FIG. 6 shows a cross-sectional view of a processing chamber 100 with sidewalls 102 and a bottom 104 taken along plane 6 shown in FIG. 5. The susceptor assembly 140 on the support post 160 is located within the processing chamber 100. The cross-sectional view passes through the central axis 105 so that two substrates 60 on the susceptor assembly 140. The cross-sectional view also shows two reactive gas ports 135 from the gas distribution assembly 120 on opposite sides of the central axis 105.

In the embodiment shown in FIG. 6, the reactive gas port 135 on the left is powered by a first power source 310 and the reactive gas port 135 on the right is powered by a second power source 320. Each of the first power source 310 and the second power source 320 are operated at a phase, which as shown, are typically about the same. Conventionally, the phases of the power sources are not controlled during processing and can drift. The inventors have found that the phase drift can cause an increase in film stress.

Figure 7:
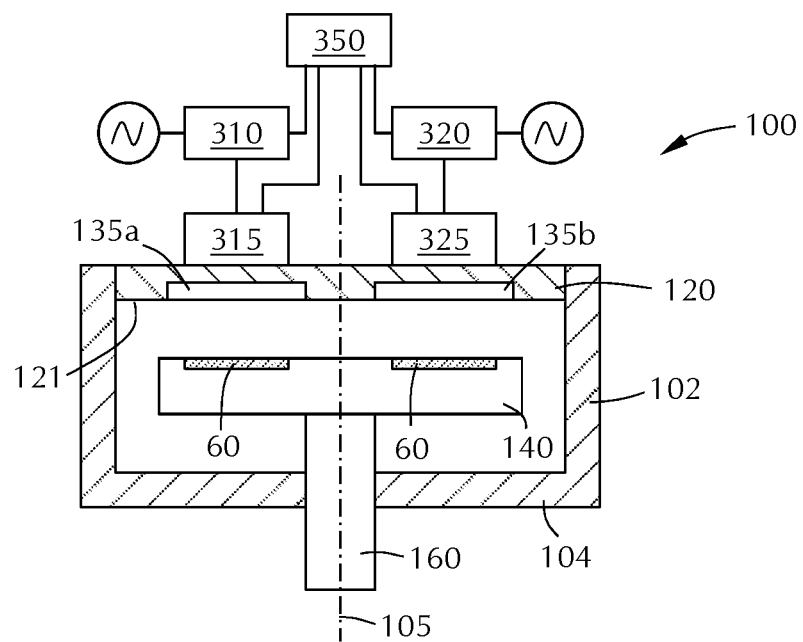
FIG. 7 shows a cross-sectional view of a batch processing chamber in accordance with one or more embodiment of the disclosure.

FIG. 7 shows an embodiment of a processing chamber 100 in accordance with one or more embodiments of the disclosure. The processing chamber 100 includes a gas distribution assembly comprising 120 comprising a plurality of reactive gas ports 135 arranged around a central axis 105. Each of the reactive gas ports 135 are separated from adjacent reactive gas ports (see FIG. 5) by a gas curtain 150.

The embodiment shown in FIG. 7 illustrates a cross-sectional view in which only two reactive gas ports are shown. These reactive gas ports provide a gas for generation of a plasma in the processing region and are referred to as plasma gas ports. The first power source 310 is connected to a first plasma gas port 135a and coupled with a first match circuit 315. The second power source 320 is connected to a second plasma gas port 135b and couple with a second match circuit 325.

A master exciter 350 is connected to each of the first power source 310, the second power source 320, the first match circuit 315 and the second match circuit 325. The master exciter 350 is configured to control the phase of one or more of the first power source 310 and the second power source 320. The master exciter 350 of some embodiments controls the phase of the power sources.

During processing, the phase of a power source can drift do to any number of factors. The master exciter 350 can be used to control the phase of the individual power sources or can provide control over any or all power sources. In some embodiments, the master exciter 350 is configured to control the phases of the first power source 310 and the second power source 320 to keep the phases about 180° apart. For example, if the first power source 310 phase drifts by 1° per minute, the master exciter 350 can change the phase of the second power source 320 so that the phases remain about 180° apart. In some embodiments, the master exciter 350 maintain the phase of the second power source 320 within about 170° to about 190° of the first power source 310. In some embodiments, the master exciter 350 maintains the phase of the second power source 320 within about 175° to about 185° of the first power source 310.

The phase of the first power source 310 and the second power source 320 can be monitored by any suitable method. In some embodiments, the phases are monitored by the master exciter 350 by monitoring the first match circuit 315 and the second match circuit 325. In some embodiments, the phase of the first power source 310 and/or the second power source 320 are adjusted by a feedback circuit that monitors the first match circuit 315 and the second match circuit 325.

The location of the plasma gas ports can be varied depending on the processing conditions and parameters. In some embodiments, the gas distribution assembly 120 comprises eight reactive gas ports arranged around the central axis 105. In one or more embodiments, the first plasma gas port 135a and the second plasma gas port 135b are positioned on opposite sides of the central axis 105.

Figure 8:
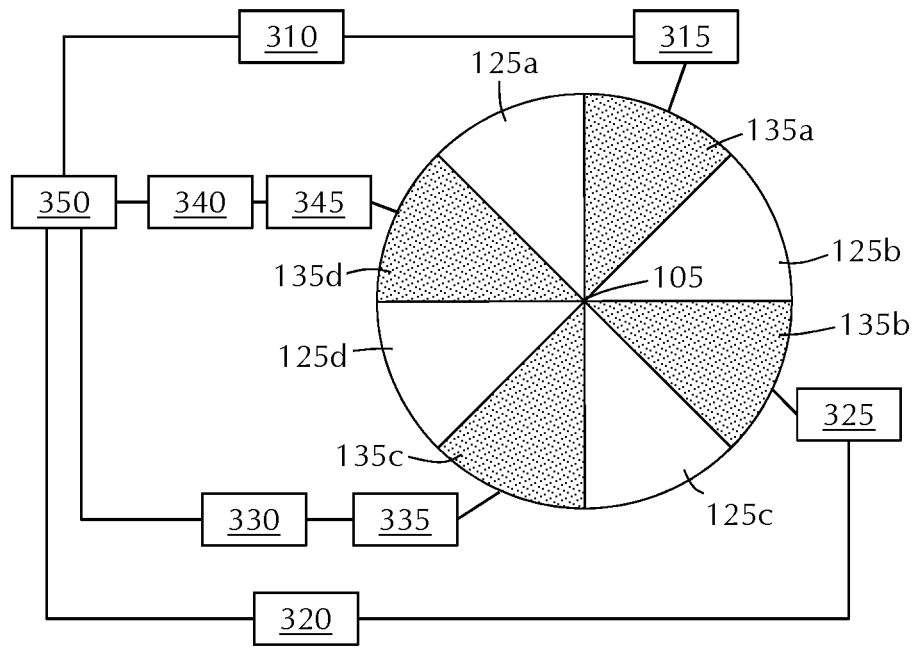
FIG. 8 shows a schematic view of a batch processing chamber in accordance with one or more embodiment of the disclosure.
Figure 9:
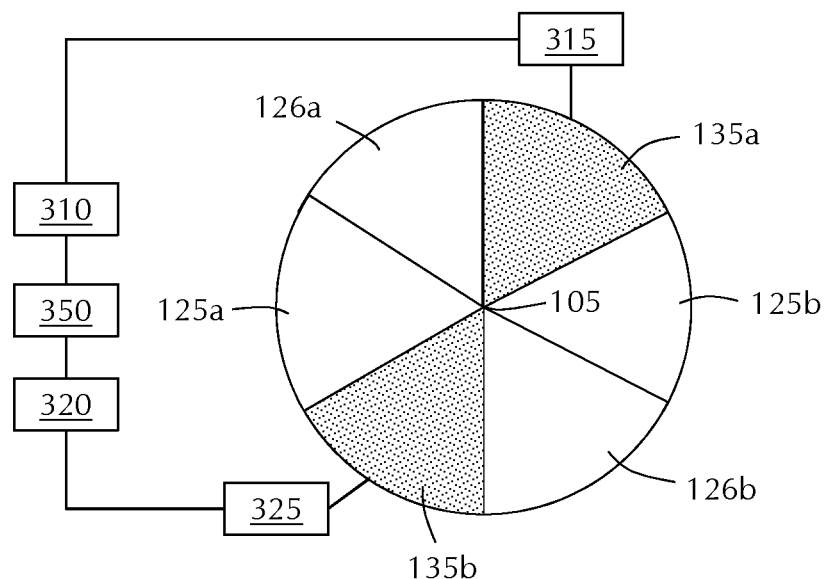
FIG. 9 shows a schematic view of a batch processing chamber in accordance with one or more embodiment of the disclosure.

In some embodiments, there are four plasma gas ports positioned around the central axis 105. FIG. 8 shows an embodiment with a first power source 310 with a first match circuit 315, a second power source 320 with a second match circuit 325, a third power source 330 with a third match circuit 335 and a fourth power source 340 with a fourth match circuit 345. Each of the power sources and match circuits are connected to a different plasma gas port so that there are four independent plasma gas ports 135a, 135b, 135c, 135d arranged around the central axis 105. The master exciter 350 is also connected to each of the power sources and the match circuits and controls the phase of one or more of the power sources.

In some embodiments, the first plasma gas port 135a, the second plasma gas port 135b, the third plasma gas port 135c and the fourth plasma gas port 135d are positioned at increments of about 90° around the central axis 105. In one or more embodiments, there is at least one reactive gas port 125a, 125b, 125c, 125d between each of the plasma gas ports 135a, 135b, 135c, 135d. In some embodiments, each of the reactive gas ports 125a, 125b, 125c, 125d and the plasma gas ports 135a, 135b, 135c, 135d are separated by a gas curtain (see FIG. 5).

In some embodiments, each of the power sources has a phase that is controlled in the range of about 170° to about 190° relative to the phase of the adjacent power sources. For example, the phase of plasma gas port 135a can be maintained about 180° from the phase of the plasma gas port 135d and plasma gas port 135b which are located on either side of the plasma gas port 135a. In some embodiments, the phase of the opposite plasma gas ports, relative to the central axis 105, is about the same while the phases of the alternating gas ports is about 180° different.

In some embodiments, the phases of the gas ports are maintained about 90° apart so that the phase of the fourth plasma gas port 135d is about 90° higher than the phase of the third plasma gas port 135c which is about 90° higher than the phase of the second plasma gas port 135b which is about 90° higher than the phase of the first plasma gas port 135a.

In some embodiments, as shown in FIG. 7, the susceptor assembly 140 positioned a distance from the gas distribution assembly 120. The susceptor assembly 140 is configured to support a plurality of substrates 60 in recesses formed in a top surface of the susceptor assembly 140. The susceptor assembly acts as a ground path for plasma generated by any of the power sources in any of the plasma gas ports.

Some embodiments of the disclosure are directed to methods of processing a substrate or forming a film on a substrate. A first power source 310 connected to a first plasma gas port 135a in a first process region of a processing chamber is powered. The first power source 310 is coupled to a first match circuit. A second power source 320 connected to as second plasma gas port 135b in a second process region that is different from the first process region of a processing chamber is powered. The second power source 320 is coupled to a second match circuit 325. The phase of one or more of the first power source 310 or the second power source 320 is controlled using a master exciter 350 connected to the first power source 310, the second power source 320, the first match circuit 315 and the second match circuit 325.

In some embodiments, the master exciter 350 monitors feedback from the first match circuit 315 and the second match circuit 325 and adjusts the phase of one or more of the first power source 310 and the second power source 320 based on the feedback to maintain the phase of the first power source 310 and the second power source 320 to be within the range of about 170° to about 190° apart.

Some embodiments further comprise powering a third power source 330 connected to a third plasma gas port 135c in a third process region of the processing chamber. The third process region is different from the first process region and the second process region. The third power source 330 is coupled to a third match circuit 335. A fourth power source 340 connected to a fourth plasma gas port 135d in a fourth process region of the process chamber. The fourth process region is different from the first process region, the second process region and the third process region. The fourth power source 340 is coupled to a fourth match circuit 345. The master exciter 350 is connected to and capable of controlling the third power source 330 and/or the fourth power source 340.

Some embodiments of the disclosure are directed to methods of depositing a film. The film of some embodiments comprises silicon oxide, silicon nitride, silicon oxynitride, silicon carbide, silicon carbonitride or silicon oxycarbonitride. The film of some embodiments comprises silicon and one or more of carbon, oxygen or nitrogen atoms.

Figure 10:
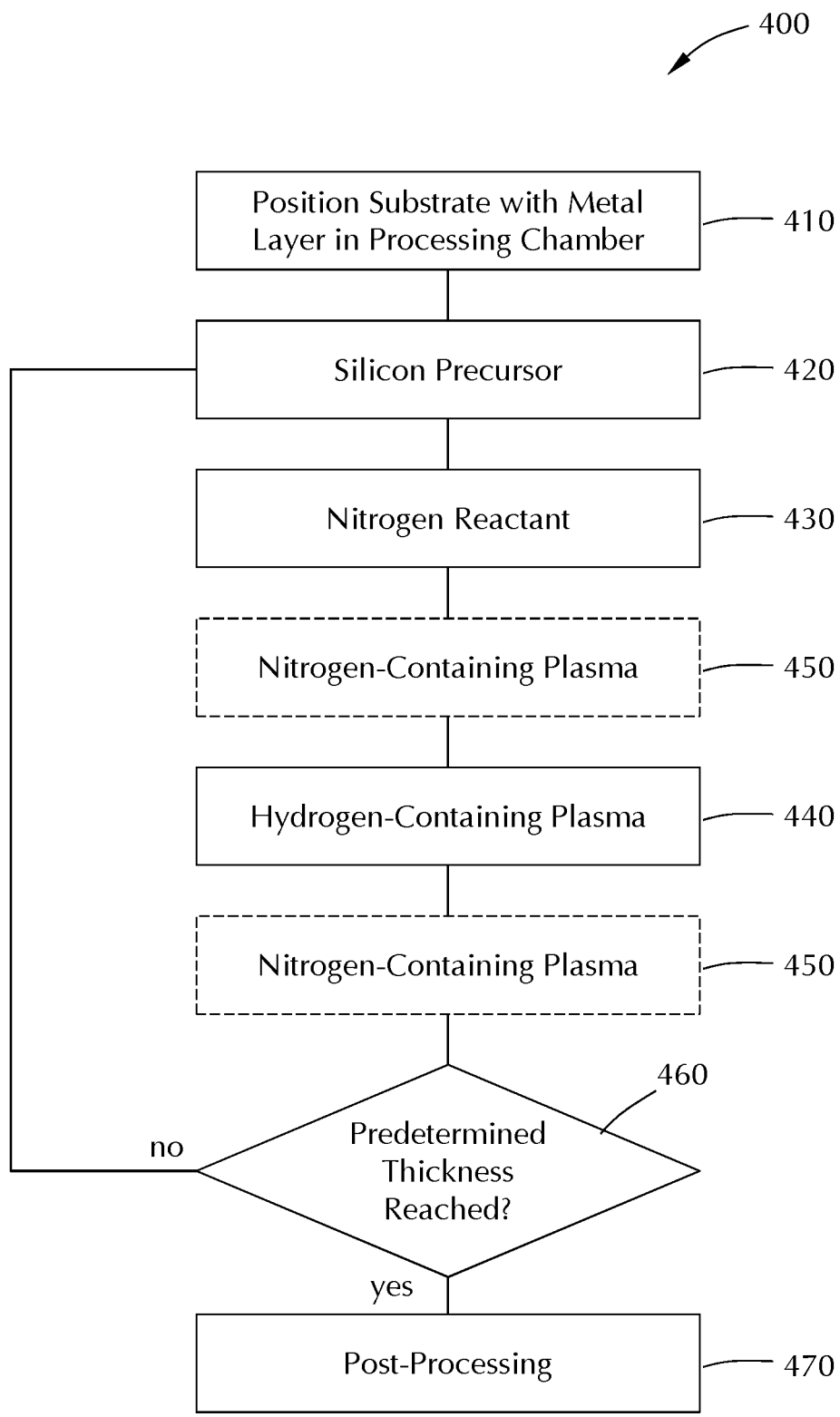
FIG. 10 shows a flowchart for a processing method in accordance with one or more embodiment of the disclosure.
Figure 11:
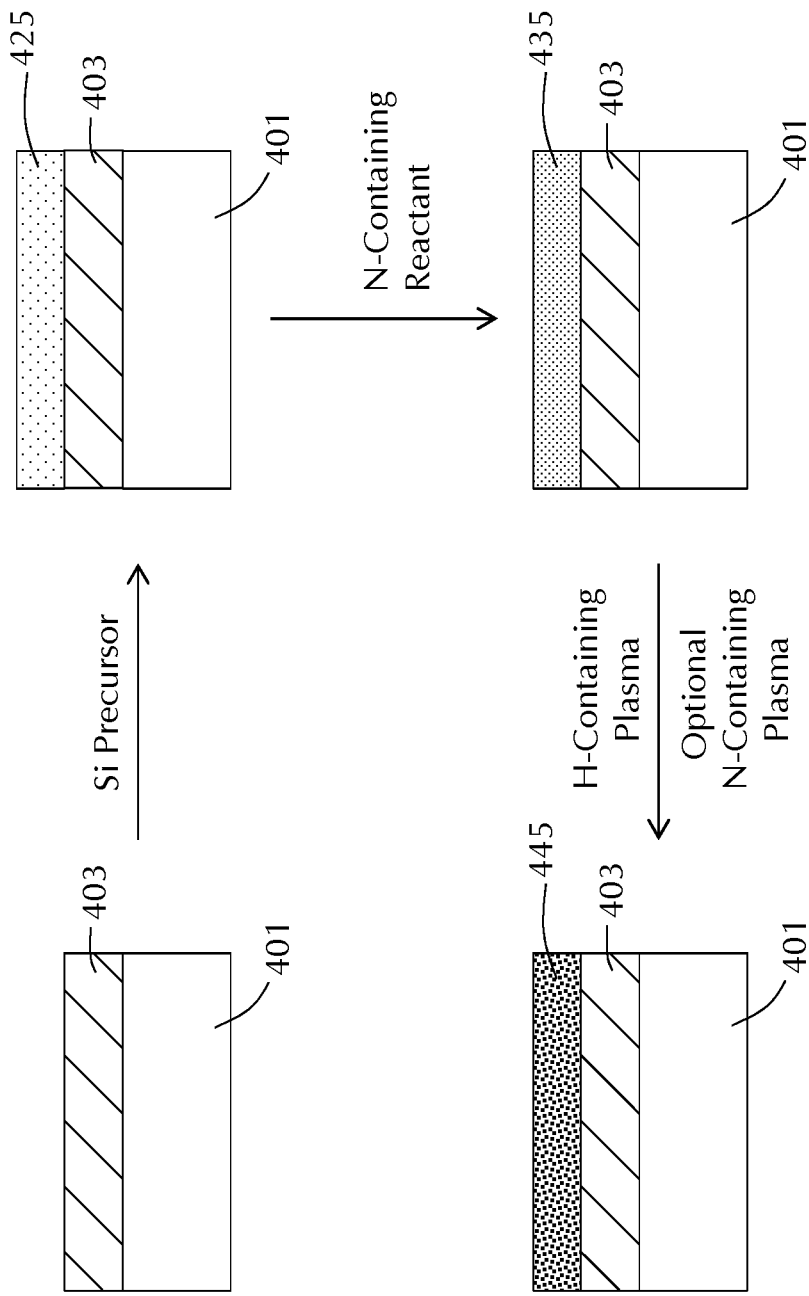
FIG. 11 shows a schematic representation of a processing method in accordance with one or more embodiment of the disclosure.

FIGS. 10 and 11 show a method 400 for forming a silicon nitride film in accordance with one or more embodiment of the disclosure. While the embodiment shown in FIGS. 10 and 11 form a SiN film, those skilled in the art will understand that this is merely representative of one possible process and that other materials can be formed.

A substrate 401 having a metal layer 403 thereon is provided at 410. As used in this regard, the term "provided" means that the substrate 401 is at least positioned within a processing chamber for film formation. The substrate 401 can be any suitable substrate.

The metal layer 403 can be made of any suitable metal. In some embodiments, the metal layer 403 comprises cobalt. In some embodiments, the metal layer 403 consists essentially of cobalt. As used in this manner, the term "consists essentially of cobalt" means that the metal layer 403 is greater than or equal to about 95%, 98% or 99% cobalt on an atomic basis.

The thickness of the metal layer 403 can be any suitable thickness depending on, for example, the purpose and use of the metal layer 403. In some embodiments, the metal layer 403 has a thickness in the range of about 1 Å to about 10,000 nm. The metal layer 403 thickness of some embodiments is in the range of about 10 nm to about 500 nm. In some embodiments, the metal layer 403 is a cobalt liner.

At 420, the metal layer 403 is exposed to a silicon precursor to form a silicon-containing film 425 on the metal layer 403. The silicon precursor can be any suitable silicon precursor including, but not limited to, organosilanes and halogenated silanes. In some embodiments, the silicon precursor comprises one or more of monochlorosilane, monobromosilane, monoiodosilane, dichlorosilane, dibromosilane or diiodosilane. In some embodiments, the silicon precursor consists essentially of dichlorosilane. As used in this regard, the term "consists essentially of" means that the reactive species present in the silicon precursor is greater than or equal to about 95%, 98% or 99% of the stated species on a molar basis. The inert diluent or carrier gases are not included in the calculation of reactive species content. In some embodiments, the silicon precursor consists essentially of monochlorosilane. In some embodiments, the silicon precursor consists essentially of dibromosilane. In some embodiments, the silicon precursor consists essentially of monobromosilane. In some embodiments, the silicon precursor consists essentially of diiodosilane. In some embodiments, the silicon precursor consists essentially of monoiodosilane. In some embodiments, the silicon precursor comprises a dihalosilane. As used in this manner, a "dihalosilane" is a silane compound with two halogen atoms and two hydrogen atoms. The halongen atoms can be any of chlorine, bromine or iodine. In some embodiments, the silicon precursor comprise a chlorine based silane (e.g., $SiClH_3$, $SiCl_2H_2$, $SiCl_3H$, $Cl_3Si-SiCl_3$, $Cl_2HSi-SiHCl_2$, $Cl_3Si-SiH_2Cl$).

The silicon-containing film 425 is generally chemisorbed to the metal layer 403 through a physical and/or chemical interaction at the surface of the metal layer 403. In a time-domain ALD process, the processing chamber is purged of unreacted silicon precursor and reaction by-products. In a spatial ALD process, the substrate is moved from the process region containing the silicon precursor through a gas curtain. The silicon-containing film 425 at least partially remains on the surface of the metal layer 403 upon purging of the process chamber or movement through a gas curtain. Those skilled in the art will understand that some amount of chemisorbed molecules might be displaced during the purging process or while passing through the gas curtain.

At 430, the silicon-containing film 425 is exposed to a nitrogen-containing reactant to form a silicon nitride film 435 on the metal layer 403. The nitrogen-containing reactant can be any suitable nitrogen containing gas including, but not limited to, molecular nitrogen, ammonia, hydrazine, a nitrogen oxide compound, or a combination thereof. In some embodiments, the nitrogen-containing reactant comprises at least one N—H bond. In some embodiments, the nitrogen containing reactant consists essentially of ammonia. As used in this regard, the term "consists essentially of ammonia" means that the reactive species present in the nitrogen-containing reactant is greater than or equal to about 95%, 98% or 99% ammonia on a molar basis. The inert diluent or carrier gases are not included in the calculation of reactive species content. In some embodiments, the nitrogen-containing reactant comprises an amine mixed with an inert gas. In some embodiments, the silicon nitride film 435 is formed by a thermal process. As used in this manner, a "thermal process" does not use a plasma or plasma-based reactant. For example, the nitrogen-containing reactant in a thermal process is not provided as or with a plasma.

In some embodiments, the silicon nitride film 435 is a conformal film. As used in this manner, a "conformal film" has a thickness that remains substantially uniform so that the thickness of the film does not vary by greater than or equal to about 10%, 5% or 2% relative to the average thickness. For example, a conformal film deposited into a trench has about the same thickness at the bottom of the trench, the bottom of the trench sidewalls, the middle of the trench sidewalls, the top of the trench sidewalls and the top surface that the trench is formed in.

At 440, the silicon nitride film 435 is exposed to a hydrogen plasma to form a low etch silicon nitride film 445. As used in this specification and the appended claims, the term "low etch silicon nitride film" refers to silicon nitride film which has been subjected to a treatment to lower the wet etch rate in 1% HF. The hydrogen-containing plasma of some embodiments consists essentially of hydrogen. As used in this regard, the term "consists essentially of hydrogen" means that the reactive species present in the plasma is greater than or equal to about 95%, 98% or 99% hydrogen on an atomic basis. The inert diluent or carrier gases are not included in the calculation of reactive species content.

In some embodiments, the hydrogen-containing plasma comprises hydrogen and one or more of nitrogen and argon atoms. In some embodiments, the hydrogen-containing plasma comprises in the range of about 1 to about 99% hydrogen on an atomic basis, or in the range of about 10 to about 90% hydrogen on an atomic basis, or in the range of about 20 to about 80% hydrogen on an atomic basis. In some embodiments, the hydrogen-containing plasma comprises greater than or equal to about 40%, 50%, 60%, 70%, 80% or 90% hydrogen on an atomic basis.

In some embodiments, at 450 the method 400 further comprises exposing the silicon nitride film 435 to a nitrogen plasma. The silicon nitride film 435 can be exposed to the nitrogen plasma before exposure to the hydrogen-containing plasma at 440, after exposure to the hydrogen-containing plasma at 440, or both before and after.

In some embodiments, the hydrogen-containing plasma and the nitrogen plasma are mixed into a hydrogen-containing plasma with a nitrogen content. In some embodiments, the hydrogen-containing plasma comprises hydrogen and nitrogen in a combined amount greater than or equal to about 70%, 80%, 90% or 95% on a molar basis as the reactive component.

The hydrogen-containing plasma and/or nitrogen-containing plasma can be generated by any suitable plasma apparatus. The plasma can be a direct plasma where the substrate or pedestal acts as an electrode for plasma generation. In some embodiments, the plasma is a remote plasma where the plasma is generated without use of the substrate or pedestal in the electrical path.

In some embodiments, the hydrogen-containing plasma is generated in a vertical plasma source (VPS). A vertical plasma source generates a plasma between vertically oriented electrodes so that the gap between plate electrodes extends in a direction substantially perpendicular to the surface of the substrate. A plasma can be created between the plates while the gas species flows between the plates toward the wafer surface. The plasma is substantially confined to the source and minimizes sputtered material from the powered plate reaching the wafer surface. Some embodiments of the disclosure advantageously provide a plasma source that minimizes or eliminates contamination of the substrate by material sputtered from the hot electrode. Some embodiments also advantageously provide a soft plasma that does not substantially change of the substrate surface. One or more embodiments provide an apparatus that can generate a plasma without allowing the electrical return path to go through the substrate. Some embodiments of the disclosure provide modular remote plasma sources that can be added to or removed from a gas distribution assembly. The remote plasma source generates a plasma without using the substrate or substrate support as an electrode.

Referring to FIGS. 12 through 17, one or more embodiments of the disclosure are directed to modular capacitively coupled plasma sources 500 and processing methods employing same. As used in this specification and the appended claims, the term "modular" means that plasma source 500 can be attached to or removed from a processing chamber. A modular source can generally be moved, removed or attached by a single person.

Figure 12:
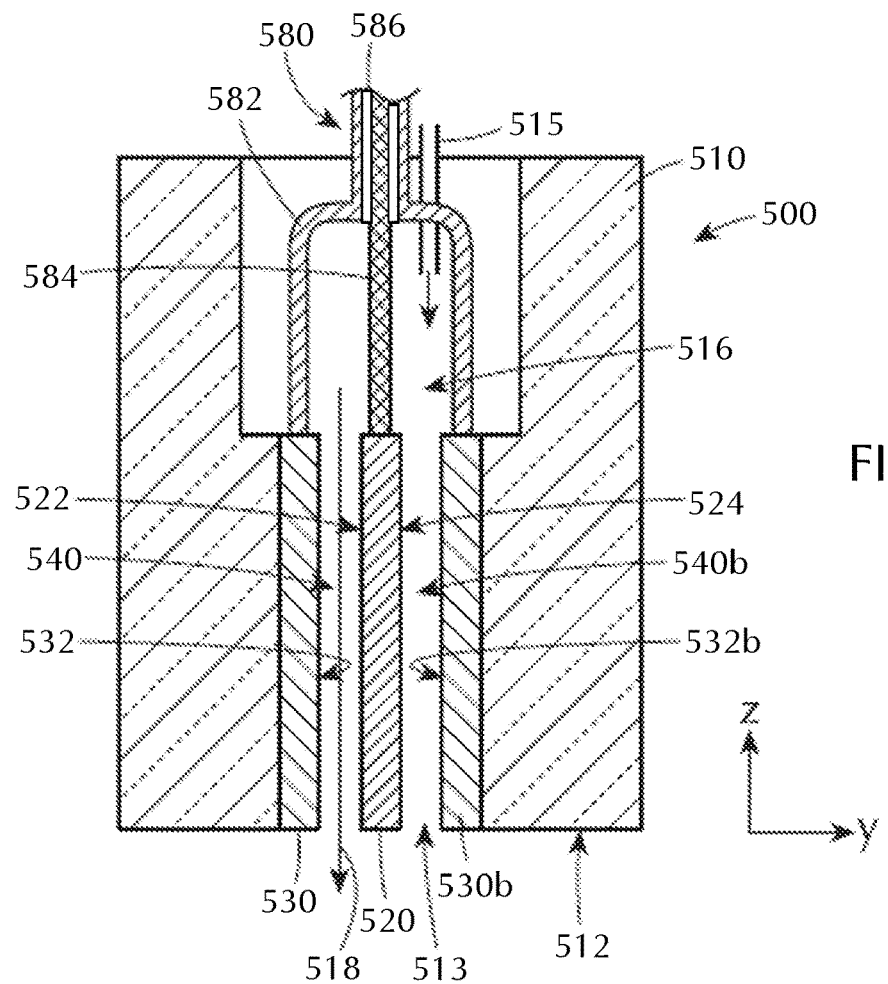
FIG. 12 shows a schematic cross-sectional view of a plasma source assembly in accordance with one or more embodiment of the disclosure.

FIG. 12 shows a cross-section of a plasma source assembly 500 in accordance with one or more embodiment of the disclosure. The plasma source assembly 500 shown in FIG. 12 includes a housing 510 with a gas inlet 515 and a front face 512. The gas inlet 515 allows a flow of gas to move along the flow path 518 through the housing 510 and out an opening 513 in the front face 512. The embodiment shown has a gas inlet 515 illustrated off-center for descriptive purposes, but those skilled in the art will understand that the gas inlet 515 can be centered in the housing 510. Additionally, some embodiments include a plenum 516 to increase the uniformity of the gas flow through the flow path 518.

The plasma source assembly 500 includes an RF hot electrode 520 and at least one return electrode 530. The return electrode 530 is any conductive material that forms a complete circuit with the RF hot electrode 520. Those skilled in the art will understand that the return electrode 530 can provide a pathway for electrons to flow. The term "return" used in this manner means that the electrode is part of the electrical pathway of the plasma components and does not imply a direction for the flow of current or electrons.

Figure 13:
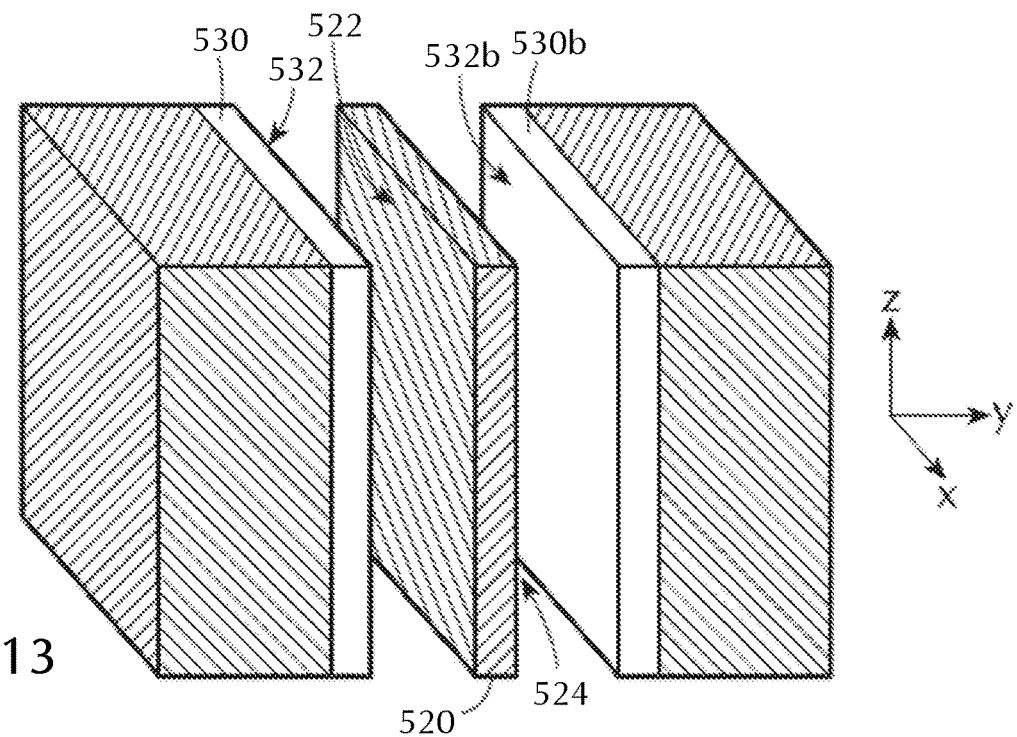
FIG. 13 shows a partial perspective view of a plasma source assembly in accordance with one or more embodiments of the disclosure.
Figure 14:
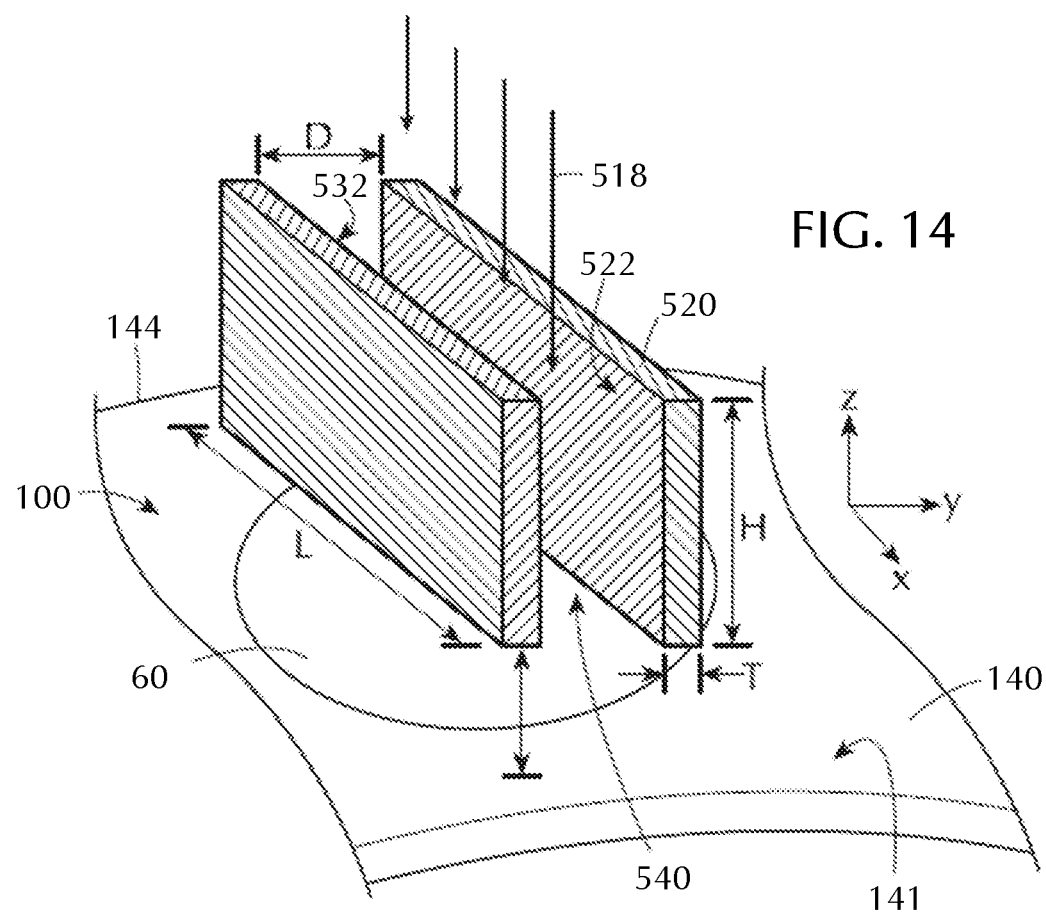
FIG. 14 shows a partial perspective view of a plasma source assembly in accordance with one or more embodiments of the disclosure.

Referring to FIGS. 12 to 14, the RF hot electrode 520 has a first surface 522 and a second surface 524 opposite the first surface 522. FIG. 12 shows a cross-section of a plasma source assembly 500 while FIGS. 13 and 14 show partial perspective views of the electrodes. As used in this regard, the first surface 522 and second surface 524 are on opposite sides of the thickness T of the RF hot electrode 520. The RF hot electrode 520 is a generally shaped as a rectangular prism with a height H, thickness T and length L. The RF hot electrode 520 has a first surface 522 oriented substantially parallel to the flow path 518. As used in this regard, the term "substantially parallel" means that the surface is within ±10° of parallel (defined as 0°).

The return electrode 530 is similarly shaped to the RF hot electrode 520. The return electrode has a first surface 532 that is oriented substantially parallel to the flow path 518. The first surface 532 of the return electrode 530 is spaced from the first surface 522 of the RF hot electrode 520 to form a gap 540.

The gap between the RF hot electrode (the powered electrode) and the ground plate (the return electrode) can be varied. In some embodiments, the gap is in the range of about 4 mm to about 15 mm and may be adjustable. The width of the RF hot electrode can be varied. For example, the plates can be tapered to accelerate ions. In use, the gaseous species flowing in the gap between the RF hot electrode and the return electrode become ionized. The ionized species can then contact the substrate surface. The plasma formed by the various embodiments is a soft plasma that does not substantially change the substrate surface.

The return electrode 530, 530b can be any suitable material including, but not limited to, aluminum, stainless steel and copper. The return electrode 530, 530b can have any suitable electrical characteristics. In some embodiments, the return electrode 530, 530b is a ground electrode. A ground electrode is any conductive material in electrical contact with electrical ground.

In some embodiments, the return electrode 530, 530b is a powered electrode different from the RF hot electrode 520. As used in this manner, "different from the RF hot electrode" means that the electrical properties or potential are different from the RF hot electrode. For example, the driving power of the generated plasma may be tuned in a push-pull manner from a single source using a phase shifter to minimize interaction with the wafer. In embodiments of this sort, the RF hot electrode 520 may be, for example, 180° out of phase with the return electrode 530.

As shown in FIG. 13, some embodiments of the plasma source assembly further comprise a second return electrode 530b. The second return electrode 530b has a first surface 532b which is oriented substantially parallel to the flow path 518. The first surface 532b of the second return electrode 530b is spaced from a second surface 524 of the RF hot electrode 520 to form a gap 540b. The gap 540 and gap 540b can have the same or different dimensions. In some embodiments, the gap 540, 540b between the RF hot electrode 520 and the return electrode 530, 530b is in the range of about 4 mm to about 15 mm, or in the range of about 5 mm to about 14 mm, or in the range of about 7 mm to about 13 mm, or in the range of about 9 mm to about 12 mm, or about 11 mm.

Figure 15:
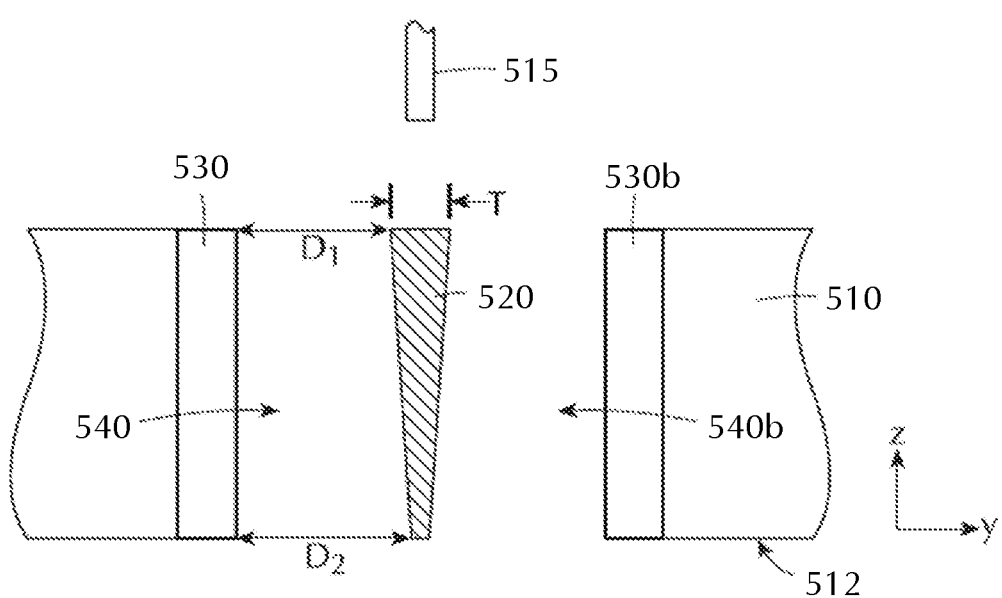
FIG. 15 shows a partial schematic side view of a plasma source assembly in accordance with one or more embodiments of the disclosure.

Referring to FIG. 15, in some embodiments the gap 540, 540b between the RF hot electrode 520 and the return electrode 530, 530b changes along the height H of the electrodes. In the embodiment shown, the thickness T is greater adjacent the gas inlet 515 than adjacent the front face 512. Stated different the size of the gap 540, 540b is smaller adjacent the gas inlet 515 than adjacent the front face 512. Without being bound by any particular theory of operation, it is believed that the tapered thickness of the RF hot electrode 520 may cause ions to the accelerated towards the wafer.

The thickness T of the RF hot electrode 520 can be any suitable thickness depending on, for example, the electrode material. In some embodiments, the RF hot electrode has a thickness in the range of about 3 mm to about 11 mm, or in the range of about 4 mm to about 10 mm, or in the range of about 6 mm to about 9 mm or about 8 mm.

The height H of the RF hot electrode 520 can be varied. In some embodiments, the height H of the RF hot electrode 520 is in the range of about 8 mm to about 40 mm, or in the range of about 9 mm to about 55 mm, or in the range of about 10 mm to about 50 mm, or in the range of about 11 mm to about 25 mm, or in the range of about 12 mm to about 20 mm, or in the range of about 13 mm to about 15 mm or about 14 mm.

Some embodiments include a spacer 560 adjacent a lower edge 529 of the RF hot electrode 520. Referring to FIG. 15, the RF hot electrode 520 is illustrated between two return electrodes 530. A spacer 560 separates the lower edge 529 of the RF hot electrode 520 from the substrate 60 and susceptor assembly 140. The presence of the spacer 560, in some embodiments, help prevent or minimize sputtering of the RF hot electrode 520 from contaminating the substrate 60. The spacer 560 can be made of any suitable material including, but not limited to, dielectrics (e.g., ceramic materials). The size of the spacer 560 can be adjusted to move the lower edge 529 of the RF hot electrode 520 from the vicinity of the substrate 60. In some embodiments, the spacer 560 has a length Ls in the range of about 10 mm to about 25 mm, or in the range of about 13 mm to about 20 mm or about 17 mm.

Figure 16:
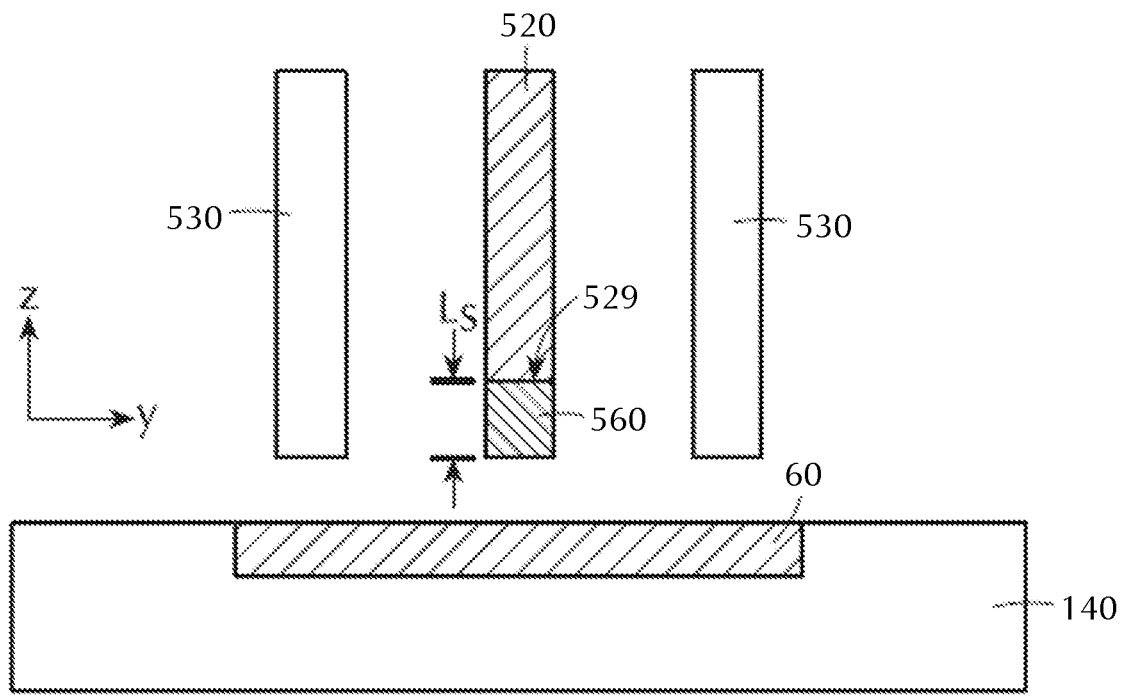
FIG. 16 shows a partial cross-sectional side schematic of a plasma source assembly electrodes in accordance with one or more embodiments of the disclosure.
Figure 17:
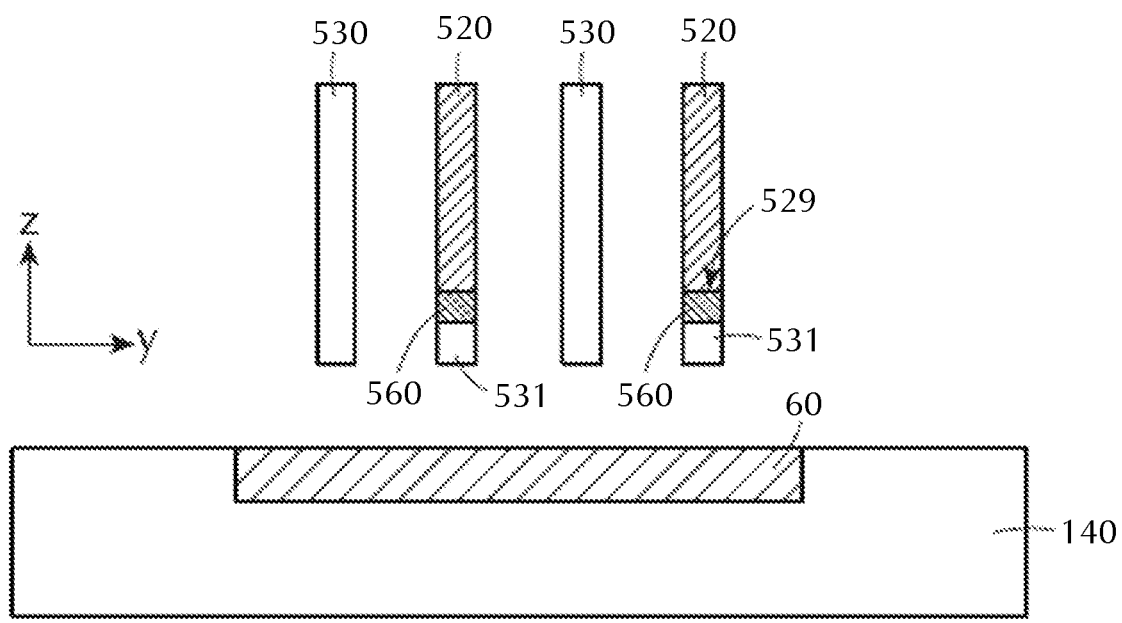
FIG. 17 shows a cross-sectional view of a processing chamber in accordance with one or more embodiments of the disclosure.

FIG. 16 shows another embodiment of the disclosure. The RF hot electrodes 520 have a spacer 560 adjacent the lower edge 529. A return electrode 531 (e.g., ground or powered) is adjacent the spacer 560 separating the spacer from the substrate 60 and susceptor assembly. Without being bound by any particular theory of operation, it is believed that the combination of the spacer 560 and return electrode 531 minimizes direct interaction of the RF hot electrode 520 with the substrate. Although two RF hot electrodes 520 and two return electrodes 530 are illustrated in FIG. 17, those skilled in the art will understand that there can by any suitable number of RF hot electrodes 520 and return electrodes 530.

The frequency of the plasma generated in the vertical plasma source can vary. In some embodiments, high frequency is used to create plasma with a high density. In some embodiments, the vertical plasma source operates at a frequency greater than 13.56 MHz, 20 MHz, 40 MHz, 60 MHz or 100 MHz.

Referring back to the method of FIG. 10, decision point 460 is reached. If the low etch silicon nitride film 445 has been grown or deposited or formed to a predetermined thickness, the method 400 moves on to some post-processing 470. If the low etch rate silicon nitride film 445 has not reached the predetermined thickness, the method 400 repeats exposure to the silicon precursor at 420, the nitrogen-containing reactant at 430 and the hydrogen-containing plasma at 440 to form a low etch silicon nitride film 445 of a predetermined thickness. The optional nitrogen-containing plasma exposures at 450 can be repeated or omitted. In some embodiments, the optional nitrogen-containing plasma exposure at 450 is performed less than every cycle of 420 to 440. For example, in some embodiments, the nitrogen-containing plasma exposure at 450 occurs every other cycle, every third cycle, every fourth cycle, every fifth cycle, every sixth cycle, every seventh cycle, every eighth cycle, every ninth cycle, every tenth cycle, every $15^{th}$ cycle, every $20^{th}$ cycle, every $25^{th}$ cycle, every $30^{th}$ cycle, every $40^{th}$ cycle, every $50^{th}$ cycle, every $100^{th}$ cycle, or at any cycle interval greater than 10.

The temperature of the method 400 can be controlled to be at a temperature sufficiently low to prevent damage to the underlying layers. Typically, low temperature deposition of a silicon nitride film on a metal layer results in a high hydrogen content in the film which creates a film with a high wet etch rate. Embodiments of the method 400 enable the low temperature deposition of silicon nitride on a metal film with low hydrogen content and lower wet etch rates. In some embodiments, the method is performed at a temperature less than or equal to about 250° C. In some embodiments, the substrate is maintained at a temperature of not more than 250° C. during exposure to the silicon precursor, nitrogen-containing reactant, hydrogen-containing plasma and optional nitrogen-containing plasma exposures. In some embodiments, the temperature of the substrate is maintained at not more than 225° C., 200° C., 175° C. or 150° C.

After formation of the low etch silicon nitride film 445 there is substantially no damage to the metal layer. As used in this regard, the term "substantially no damage" means that there are little or no cobalt spheres diffused into the low etch silicon nitride film as observed by TEM.

The low etch silicon nitride film has an etch rate in 1:100 HF:H₂O of less than or equal to about 5 Å/min. In some embodiments, the etch rate of the low etch silicon nitride film is less than or equal to about 4, 3, 2, 1 or 0.5 Å/min.

Referring to FIGS. 5 and 9 through 11, another embodiment of the disclosure is provided. The substrate 60 is exposed to a silicon precursor in a first process region 250a of a processing chamber 100. The substrate 60 is laterally moved through a gas curtain 150 to a second process region 250b of the processing chamber 100. The substrate 60 is exposed to the nitrogen-containing reactant in the second process region 250b of the processing chamber 100. The substrate 60 is laterally moved through a gas curtain 150 to a third processing region 250c of the processing chamber. The substrate 60 is exposed to a first hydrogen-containing plasma generated by a first power source 310 with a first phase that is coupled to a first match circuit 315.

The substrate 60 is laterally moved to a fourth processing region 250e of the processing chamber 100 through a gas curtain 150. The substrate is exposed to the silicon precursor in the fourth processing region 250e and moved through a gas curtain 150 to a fifth processing region 250f where the substrate is exposed to the nitrogen-containing reactant. The substrate is then laterally moved through a gas curtain 150 to a sixth processing region 250g. In the sixth processing region 250g, the substrate is exposed to a second hydrogen-containing plasma generated by a second power source 320 coupled to a second match circuit 325. The second power source 320 has a second phase. The first phase and/or the second phase are controlled to maintain a phase difference in the range of about 170° to about 190°.

In some embodiments, the first plasma and second plasma are exposed to the substrate in portions of the processing chamber 100 located on opposite sides of a central axis 105 of the processing chamber 100.

In some embodiments, the substrate is exposed to a nitrogen containing plasma in an additional processing region 250d, 250h of the processing chamber and laterally moving the substrate through a gas curtain to one of the third, fourth, fifth, sixth or first process region after exposure to the nitrogen-containing plasma. In the embodiment shown, the additional processing region 250d, 250h are located after the nitrogen-containing plasma regions. In some embodiments, the additional processing regions 250d, 250h are located between the nitrogen-containing reactant region and the hydrogen-containing plasma region of the processing chamber.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a film, the method comprising:
exposing a substrate with a cobalt layer thereon to a first silicon precursor in a first process region of a processing chamber to form a silicon-containing film;
laterally moving the substrate through a first gas curtain to a second process region of the processing chamber;
exposing the silicon-containing film to a first nitrogen-containing reactant in the second process region of the processing chamber to form a silicon nitride film without the use of plasma;
laterally moving the substrate through a second gas curtain to a third process region of the processing chamber;
exposing the silicon nitride film to a first hydrogen-containing plasma in the third process region of the processing chamber to form a low etch silicon nitride film, the first hydrogen-containing plasma generated by a first power source coupled to a first match circuit, the first power source having a first phase;
laterally moving the substrate through a third gas curtain to a fourth process region of the processing chamber;
exposing the substrate to a second silicon precursor in the fourth process region to form a silicon-containing film;
laterally moving the substrate through a fourth gas curtain to a fifth process region of the processing chamber;
exposing the silicon-containing film to a second nitrogen-containing reactant in the fifth process region of the processing chamber to form a silicon nitride film without the use of plasma;
laterally moving the substrate through a fifth gas curtain to a sixth process region of the processing chamber;
exposing the silicon nitride film to a second hydrogen-containing plasma in the sixth process region of the processing chamber to form a low etch silicon nitride, the second hydrogen-containing plasma generated by a second power source coupled to a second match circuit, the second power source having a second phase; and
controlling the first phase and/or the second phase to maintain a phase difference in the range of about 170° to about 190°.

2. The method of claim 1, wherein the third process region and the sixth process region are on opposite sides of a central axis of the processing chamber.

3. The method of claim 1, further comprising exposing the substrate to a nitrogen-containing plasma in an additional processing region of the processing chamber and laterally moving the substrate through an additional gas curtain to one of the third, fourth, fifth, sixth or first process region after exposure to the nitrogen-containing plasma.

4. The method of claim 3, wherein the additional processing region is positioned between the second process region and the third process region and between the fifth process region and the sixth process region so that the substrate is exposed to the nitrogen-containing plasma prior to exposure to the hydrogen-containing plasma.

* * * * *